(12) United States Patent  
Chen et al.

(10) Patent No.: US 8,405,047 B2  
(45) Date of Patent: Mar. 26, 2013

(54) SPECIMEN BOX FOR ELECTRON MICROSCOPE

(75) Inventors: Chih Chen, Hsinchu (TW); King-Ning Tu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/450,271

(22) Filed: Apr. 18, 2012

(65) Prior Publication Data

US 2013/0009071 A1    Jan. 10, 2013

(30) Foreign Application Priority Data

Jul. 5, 2011    (TW) .............................. 100123732 A

(51) Int. Cl.
*G21K 5/08*    (2006.01)
(52) U.S. Cl. ................... 250/440.11; 250/306; 250/307; 250/310; 250/311
(58) Field of Classification Search .................. 250/306, 250/307, 310, 311, 440.11, 441.11
See application file for complete search history.

(56) References Cited

U.S. PATENT DOCUMENTS

2007/0145287 A1*    6/2007    Chao et al. ............... 250/440.11

* cited by examiner

*Primary Examiner* — Michael Maskell
(74) *Attorney, Agent, or Firm* — Muncy, Geissler, Olds & Lowe, PLLC

(57) ABSTRACT

The present invention relates to a specimen box for an electron microscope, comprising a first substrate, a second substrate, one or more photoelectric elements, and a metal adhesion layer. The first substrate has a first surface, a second surface, a first concave, and one or more first through holes, wherein the first through holes penetrate through the first substrate. The second substrate has a third surface, a forth surface, and a second concave. The photoelectric element is disposed between the first substrate and the second substrate. In addition, the metal adhesion layer is disposed between the first substrate and the second substrate to form a space for a specimen contained therein. Besides, the present specimen box further comprises one or more plugs. When the plugs are assembled into the first through holes to seal the specimen box, the in-situ observation can be accomplished by using the electron microscope.

21 Claims, 5 Drawing Sheets

SPECIMEN BOX FOR ELECTRON MICROSCOPE

CROSS REFERENCE TO RELATED APPLICATION

This application claims the benefits of the Taiwan Patent Application Serial Number 100123732, filed on Jul. 5, 2011, the subject matter of which is incorporated herein by reference.

BACKGROUND OF THE INVENTION

1. Field of the Invention

The present invention relates to specimen box with one or more through holes for use with an electron microscope, especially to a specimen box with one or more photoelectric elements for use with an electron microscope.

2. Description of Related Art

As known in the prior art, a vacuum environment inside an electron microscope is critical for high resolution and accuracy during the observation of specimens under the electron microscope. Considering the vacuum environment, the conventional electron microscope is usually used to observe the structures of solid substances or specimens, such as dehydrated bio-tissueor dehydrated virus. Hence, the conventional electron microscope has a limitation on the selection of specimens and is invalid for the dynamic observation of specimens. Even the stimuli-induced responses of specimens are unobservable under the conventional electron microscope.

Due to the above-mentioned limitations, the application of the electron microscope is restricted. In order to improve the above-mentioned drawbacks, a specimen box for an electron microscope suitable for the observation of specimens (such as chemical particles, biochemical molecules, or bio-tissues) in a gas or liquid state was proposed. After the specimen is injected into this specimen box, a sealant or a polymer sealant is used for sealing the specimen box. However, the vacuum degree of the electron microscope may be degraded due to the easy evaporation of liquid from the specimen into the vacuum environment through the sealant or the polymer sealant. Accordingly, the resolution and the observation efficiency of the electron microscope would be greatly affected by the above-mentioned factors.

Another specimen box for an electron microscope was also suggested to solve the above issues. The specimen box further includes a gas chamber in addition to the specimen chamber. Accordingly, the gas diffusion or the liquid evaporation from the specimens in the specimen chamber can be inhibited by the pressure equilibrium between the specimen chamber and the gas chamber. However, the inert gas filled in the gas chamber for the pressure equilibrium may affect the observation resolution. In addition, the structure of this specimen box is complicated so the cost is increased.

In all of the current and above specimen boxes, none could be opened again (=reopen) after the specimen boxes are sealed. Due to finite oxygen contained in the closed space, the long-term dynamic changes and the light- or current-induced responses of the specimens cannot be observed under the electron microscope and thus the observation of living tissues or cells is limited.

According to above, providing a specimen box, which has high sealing and reopening features and allows the application of ambient stimuli (such as light, or current), is advantageous to the long-term dynamic observation of specimens in a gas or liquid state and the variation of the observation condition under an electron microscope.

SUMMARY OF THE INVENTION

The object of the present invention is to provide a specimen box for an electron microscope, in which the specimen box comprises through holes and plugs. Hence, the specimen box can be reopened to inject gas or liquid again so as to prolong the in-situ observation time effectively.

Another object of the present invention is to provide a specimen box with photoelectric elements. Hence, when the specimen is stimulated by light or current by the photoelectric elements, the observation of dynamic changes and response of the specimen could be obtained.

To achieve the object, the current specimen box for an electron microscope comprises: a first substrate, a second substrate, a metal adhesion layer, and one or more photoelectric elements. The first substrate has a first surface, a second surface, a first concave, and one or more first through holes, wherein the first concave is disposed on the second surface, a first thin film corresponding to the first concave is disposed on the first surface, and the first through hole is disposed around the first concave and penetrates through the first substrate. The second substrate has a third surface, a fourth surface, and a second concave, wherein the second concave is disposed on the fourth surface, and a second thin film corresponding to the second concave is disposed on the third surface. The metal adhesion layer is disposed between the first substrate and the second substrate. In addition, a space, which is formed by the first substrate, the second substrate, and the metal adhesion layer, could contain the gas or liquid specimens in the specimen box. The photoelectric element comprises one or more ends, wherein the photoelectric element is disposed between the first substrate and the second substrate, and the end is disposed in the space. The specimen used for the specimen box, such as chemical atoms, molecules, complexes, mixtures, bio-tissues, cells, enzymes, nerve cells, photoreceptor cells, or stem cells is not particularly limited as long as it could be observed by the electron microscope. The photoelectric element can transmit light or transfer current to the end of the photoelectric element. Therefore, the dynamic change and response of the specimen could be observed by the stimuli of light or current.

According to the specimen box of the present invention, the first through hole penetrates through the first thin film and the first substrate to connect the space in the specimen box with the outside space. Therefore, the specimen box could be opened by the first through hole, and the specimens, gas, or liquid could be inserted or injected into the specimen box through the first through hole.

In the present invention, the first concave and the second concave are formed by photolithography process accompanied by wet etching process, dry etching process, or deep reactive-ion etching process. The shape of the first concave and the second concave could be regular shape or irregular shape. Preferably, the shape of the first concave and the second concave is independently a cylinder, a cone, a cube, or a cuboid.

In the present invention, one or more third concave are disposed on the second surface of the first substrate, and one or more fourth concave are disposed on the fourth surface of the second substrate. One or more photoelectric elements are disposed on the third concave and the fourth concave. The photoelectric element could transmit light or transfer current to the end. The end could release light or current in the space. Therefore, the light or current could stimulate the specimen in the space. The third concave and the fourth concave are formed by photolithography process accompanied by wet etching process, dry etching process, or deep reactive-ion etching process, particularly, are formed by photolithography process accompanied by wet etching process. The disposition of the third concave and the fourth concave are not especially limited. The preferable position of the third concave and the fourth concave is at the diagonal position of the first substrate and the second substrate. The photoelectric element is independently a photoelectric conversion element, an optical element, or an electric element. Preferably, the photoelectric element is independently an optical fiber, or an electrode. The optical fiber is a gradient fiber, a multi-mode mutant fiber, a single mode fiber, a multi-mode fiber, a photonic crystal fiber, or etc. In the present invention, the photoelectric element could be disposed, sealed, and fixed on the third concave and the fourth concave by O-ring, sealant, polymer sealant, solder, or etc.

The metal adhesion layer of the specimen box could be disposed between the second surface and the fourth surface, the second surface and the second thin film, or the first thin film and the second thin film, in order to form a space with different volume and shape. Hence, according to the different specimen volume and different observed resolution, the volume and the shape of the space could be adjusted by the disposition of the metal adhesion layer. The volume of the space is 0.01 mm$^3$ to 100 mm$^3$. Preferably, the volume of the space is 0.05 mm$^3$ to 50 mm$^3$. Most preferably, the volume of the space is 0.1 mm$^3$ to 10 mm$^3$. The height of the space is between 10 μm to 1000 μm. Preferably, the height of the space is between 20 μm to 700 μm. Most preferably, the height of the space is between 30 μm to 550 μm. The material of the metal adhesion layer preferably comprises a metal material to form a solder, in which the metal material is selected from a group consisting of Ti, Cr, Sn, In, Bi, Cu, Ag, Ni, Zn, Au, and Ti—W alloy. Preferably, the metal material is Sn, Ni, Zn, Au, In, or a combination thereof. Most preferably, the metal material is Sn, Au, or a combination thereof. In addition, the metal adhesion layer could further comprise an adhesion layer, a metallurgy layer, and a solder layer, in which the material of the adhesion layer is Ti, Ti—W alloy, or Cr; and the material of the metallurgy layer is Ni, Cu, or Au. The metal material used in the present invention has excellent features of waterproofing, high sealing, and biocompatibility. However, the material of the metal adhesion layer has to be heated to a high temperature so as to allow the upper substrate and the lower substrate to adhere together. The high temperature thus may destroy the specimen in the specimen box. Hence, the preferably method to solve this problem is that the metal adhesion layer adheres the first substrate and the second substrate together at 70° C., then the specimen is inserted or injected into the specimen box. Therefore, the specimen would not be destroyed by the high temperature.

In the present invention, the second substrate could further comprise one or more second through holes, in which the second through hole is disposed around the second concave and penetrates through the second substrate. Therefore, the space of the specimen box could connect with the outside space, and the specimen, gas, and liquid could be inserted or injected into the space through the second through hole.

The hole size of the mentioned first through hole is 10 μm to 1000 μm. Preferably, the hole size of the first through hole is 50 μm to 700 μm. Most preferably, the hole size of the first through hole is 100 μm to 500 μm. In addition, the hole size of the mentioned second through hole is 10 μm to 1000 μm. Preferably, the hole size of the second through hole is 50 μm to 700 μm. Most preferably, the hole size of the second through hole is 100 μm to 500 μm. The hole size of the first through hole and the second through hole could be adjusted according to the different requirements for observation. The method for forming the first through hole and the second through hole is preferably a deep reactive-ion etching process or laser drilling process. In fact, the first through hole and the second through hole are passages to inject a gas specimen or a liquid specimen. Additionally, the first through hole and the second through hole also could be used to inject gas or liquid such as oxygen, nitrogen, buffer, or medium, as is required by the specimen. Therefore, the observation time of the specimen could be prolonged. For example, if oxygen and medium are injected into the space via the through hole, the lifetime of the cell specimen in the specimen box could not only be prolonged, but also the in-situ observation time is prolonged. The dynamic changes of the cell specimen could therefore also be observed. In the present invention, the specimen box for an electron microscope of the present invention could further comprise one or more plugs assembled into the first through holes and the second through holes. The material of the plug is not especially limited, which could be metal, memory metal, polymer, plastic, ceramic, acrylic, or a combination thereof. Preferable, the material of the plug is memory metal, polymer, plastic, ceramic, or a combination thereof. Most preferably, the material of the plug is memory metal. Then, the material of memory metal could select from a group consisting of Ni—Ti alloy, copper-base alloy, Cu—Zn alloy, Cu—Al—Mn alloy, Cu—Al—Ni alloy, Cu—Al—Be alloy, Cu—Al—Be—Zr alloy, and Cu—Al—Ni—Be alloy. Preferably, the material of memory metal is Ti—Ni alloy, Cu—Zn alloy, Cu—Al—Ni alloy, or a combination thereof. Most preferably, the material of memory metal is Ni—Ti alloy. Because memory metal has a property of thermal expansion and contraction, the plugs of the present invention preferably are used for sealing the through hole, and a tight sealing of the specimen box in the present invention could be accomplished.

In the specimen box for an electron microscope of the present invention, the material of the first thin film and the second thin film is independently silicon dioxide ($SiO_2$), silicon nitride ($Si_3N_4$), or a combination thereof. The function of the first thin film and the second thin film is increasing the selectivity in the etching process and enhancing the hardness of the surface of the first substrate and the second substrate. In addition, the thickness of the first thin film and the second thin film is independently 1 nm to 100 nm. Preferably, the thickness of the first thin film and the second thin film is independently 5 nm to 80 nm.

In the present invention, the specimen box further comprises a first protective layer on the surface of the first thin film, in which the first protective layer is disposed on the surface of the first thin film. Similarly, the specimen box also comprises a second protective layer on the surface of the second thin film, in which the second protective layer is disposed on the surface of the second thin film. Preferably, the material of the first protective layer and the second protective layer is silicon nitride ($Si_3N_4$), in which silicon nitride ($Si_3N_4$) is hard enough to protect the first thin film and the second thin film, and could prevent cracking of the first thin film and the second thin film. Furthermore, the first protective layer and the second protective layer could increase the selectivity in the etching process.

In the specimen box of the present invention, the first substrate and the second substrate is independently silicon substrate, glass substrate, or polymer substrate. Preferably, the first substrate and the second substrate is silicon substrate. In addition, the thickness of the first substrate and the second substrate is independently about 10 μm to 1000 μm. Preferably, the thickness of the first substrate and the second substrate is independently about 100 μm to 250 μm.

According to above, before the specimen is injected in the specimen box, the photoelectric elements are disposed, fixed, and sealed on the third concave and the fourth concave by O-ring, sealant, polymer sealant, or solder, preferably by solder. Then, the metal adhesion layer adheres the first substrate and the second substrate together at high temperature. Besides, the specimen box comprises the first through hole and the second through hole, which are passages to insert or inject the specimen into the space of the specimen box. When the specimen is inserted or injected into the specimen box, the plugs, especially the memory metal plugs, would be assembled into the first through holes and the second through holes to tightly seal the specimen box by the feature of thermal expansion and contraction of the plugs. Therefore, the specimen was totally sealed in the specimen box so as to be observed through the electron microscope. When the specimen box is removed from the electron microscope, the plugs could be removed to reopen the specimen box temporarily. Therefore, a gas or liquid, as may be required by the specimen, could additionally be injected into the specimen box to prolong the lifetime of the specimen.

In addition, the manufacturing method of the specimen box in the present invention is less complicated than the prior art, and the materials of the specimen box of the present invention are also easy to obtain. According to the above improvements of the specimen box in the present invention, the kinds of specimens which could be observed by an electron microscope are increased. After the specimen is stimulated by the photoelectric elements, the in-situ observation of the specimen could be obtained by using the specimen box of the present invention.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

EXAMPLE 1

Figure 1:
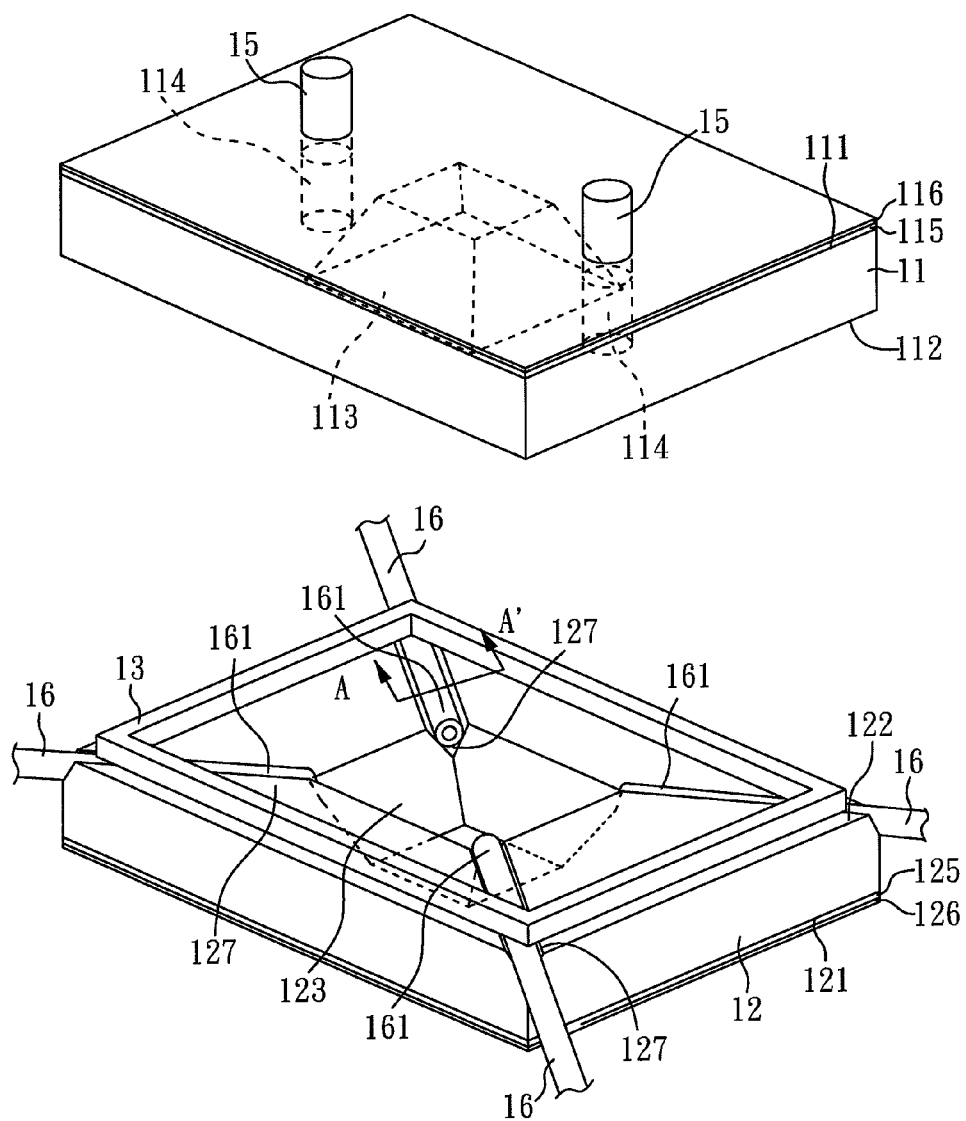
FIG. 1 is a three-dimensional view showing the specimen box for an electron microscope of the example 1.
Figure 2:
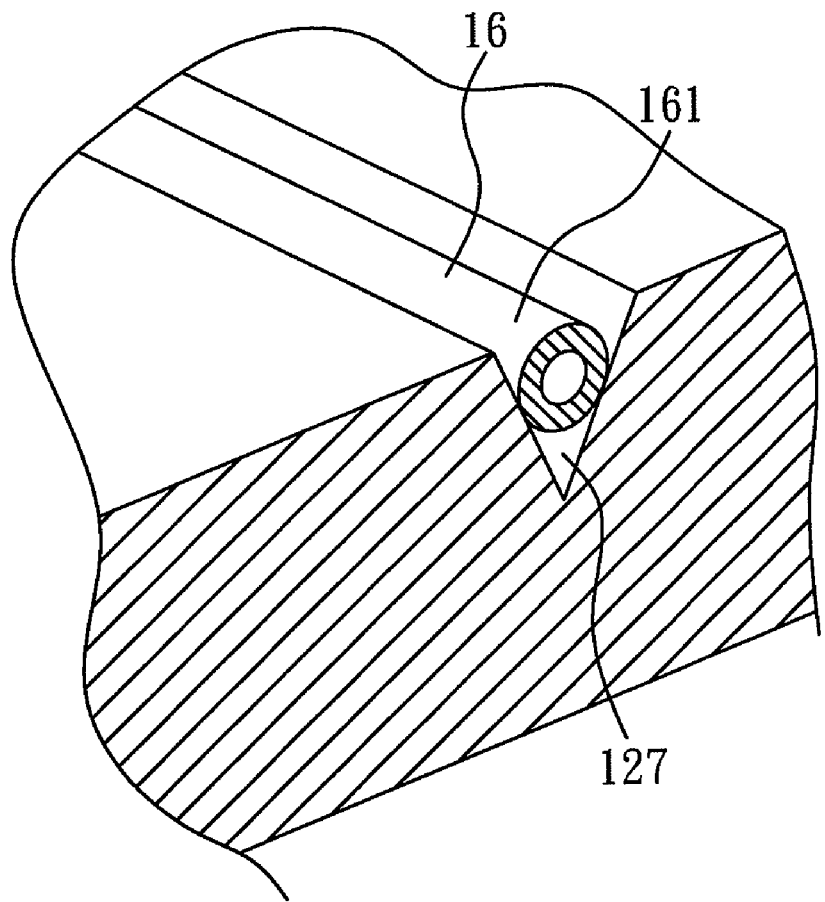
FIG. 2 is a three-dimensional view showing the photoelectric element of the specimen box for an electron microscope.
Figure 3:
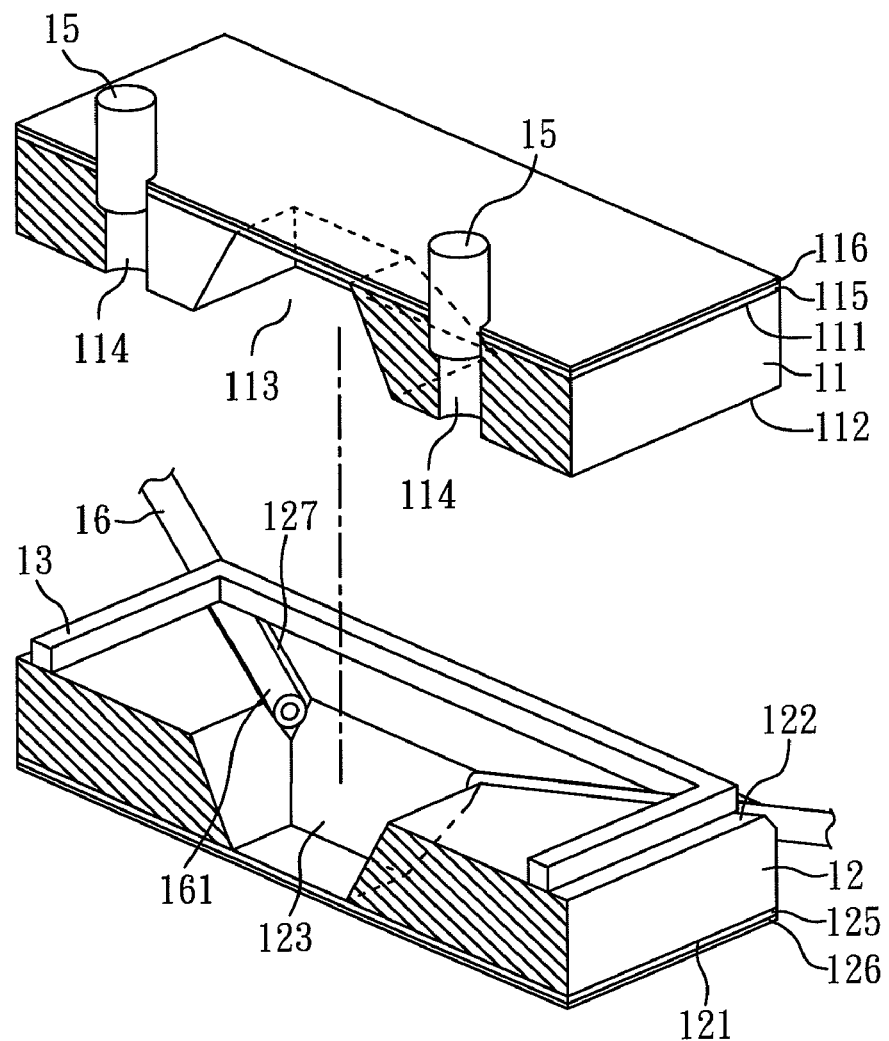
FIG. 3 is a perspective view showing the specimen box for an electron microscope of the example 1.

As showing in FIG. 1, FIG. 2, and FIG. 3, FIG. 1 a three-dimensional view showing the specimen box for electron microscope of the example 1; FIG. 2 is a three-dimensional view showing the photoelectric element of the specimen box for an electron microscope; and FIG. 3 is a three-dimensional view, which is shown along the A-A' section line in FIG. 1, showing the specimen box for an electron microscope of the example 1. According to FIG. 1, FIG. 2, and FIG. 3, the specimen box of the present invention comprises: a first substrate 11, a second substrate 12, a metal adhesion layer 13, and four photoelectric elements 16. In the present example, the first substrate 11 and the second substrate 12 are (001) silicon substrate. The thickness of the first substrate 11 is 250 μm, and the thickness of the second substrate 12 is also 250 μm.

The first substrate 11 has a first surface 111, a second surface 112, a first concave 113, and two first through holes 114, in which the first concave 113 is disposed on the second surface 112, and a first thin film 111 corresponding to the first concave 113 is disposed on the first surface 111. In addition, the first through holes 114 is disposed around the first concave 113 and penetrates through the first substrate 11.

The second substrate 12 has a third surface 121, a fourth surface 122, and a second concave 123, in which the second concave 123 is disposed on the fourth surface 122, and a second thin film 125 corresponding to the second concave 123 is disposed on the third surface 121.

Additionally, the metal adhesion layer 13 is disposed between the second surface 112 of the first substrate 11 and the fourth surface 122 of the second substrate 12, in which a space (not shown) was formed by the second surface 112, the fourth surface 122, and the metal adhesion layer 13. Gas or liquid specimens could be contained in the space (not shown). In the present example, the specimen is not especially limited as long as the specimens could be observed by an electron microscope.

According to FIG. 1, FIG. 2, and FIG. 3, four fourth concaves 127 are formed on the diagonal position of the second surface 122 of the second substrate, in which the fourth concaves 127 are formed along the direction of <110> by photolithography process accompanied by the wet etching process. The etching solution of the wet etching process is NaOH solution. The shape of the fourth concave is V-shape. According to FIG. 2, the photoelectric element 16 is disposed on each of the fourth concave 127, and the end 161 of the photoelectric element 16 connects with the space (not shown). Therefore, the specimen in the space (not shown) could be stimulated by light or electricity.

The photolithography process and the wet etching process are used for forming the first concave 113 on the second surface 112 and the second concave 123 on the fourth surface 122. The shape of the first concave 113 and the second concave 123 is cone.

In addition, the deep reactive-ion etching process is used for forming the first through holes 114, in which the first through holes 114 penetrate through the first thin film 115 and the first substrate 11. The hole size of the first through holes 114 is 250 μm.

The function of the first through holes 114 is as passages to insert or inject the specimen into the space (not shown). Besides, the first through holes 114 could also inject gas (such as oxygen, or nitrogen) or liquid (such as buffer, acidic solution, or basic solution) to further observe the dynamic changes of the specimen.

The material of the first thin film 115 and the second thin film 125 in the present example is $SiO_2$, in which the function is enhancing the hardness of the first substrate 11 and the second substrate 12 to avoid cracking of the substrates and increase the selectivity in the etching process.

In the present example, the photoelectric element 16 is formed and fixed on the fourth concave 127 by solder. The end 161 of the photoelectric element 16 is connected with the space (not shown), the other end of the photoelectric element 16 is extended out from the specimen box, which connects with the source of light or electricity. In the present example, the photoelectric element 16 is an optical fiber, an electrode, or the combination of optical fiber and electricity.

The metal adhesion layer 13 in the present example comprises an adhesion layer, a metallurgy layer, and a solder layer, in which the material of the adhesion layer is Ti—W alloy, and the material of the metallurgy layer is Cu. In the present example, the metal adhesion layer 13 adheres the first substrate 11 and the second substrate 12 to form the space 14 by the method of automatic alignment packaging method at 150° C. After the first substrate 11 and the second substrate 12 are adhered together, the specimen would be inserted or injected into the space (not shown) of the specimen box.

An electron beam from the electron microscope would penetrate through the first concave 113 to the space (not shown) and penetrate through the second concave 123. The volume of the space (not shown) is 4 mm$^3$, and the height of the space 14 is 550 μm. In order to enhance the hardness and etching selectivity of the substrate, a first protective layer 116 is disposed on the surface of the first thin film 115, and a second protective layer 126 is disposed on the surface of the second thin film 125. Furthermore, the material of the first protective layer 116 and the second protective layer 126 is silicon nitride ($Si_3N_4$).

Finally, the specimen box has two plugs 15, which could seal the first through holes 114, to totally seal the specimen box. In addition, the plugs 15 also could be removed from the first through holes 114, therefore, the specimen box could be reopened according to the requirement of the in-situ observation. The material of the plugs 15 is Ti—Ni alloy. Because Ti—Ni alloy has the property of thermal expansion and contraction, the volume of the plugs 15 is smaller below freezing point than at room temperature. Therefore, when the plugs 15 below freezing point are assembled in the first through holes 114 of the specimen box with the room temperature, the volume of the plugs 15 would gradually expand according to the gradually warming plugs 15. Afterwards, the specimen box would be sealed completely as long as the first through holes 114 are sealed by the plugs 15.

In the present example, a method of using a specimen box for observing a living specimen is shown. First, the cell specimen is inserted or injected in the space 14 through the first through holes 114. The plugs 15 below freezing point are assembled in the first through holes 114. After the temperature of the plugs 15 are warmed to room temperature, the specimen box would be sealed. Then, the specimen box is placed in the electron microscope to observe the cell specimen. In the process of the observation, the specimen could be stimulated by light, current, or the combination thereof, to complete the in-situ observation of the dynamic changes and response of the specimen. According to the requirements of the observation, one could further inject oxygen or medium by removing and then replacing the plugs 15 to complete the in-situ observation of the cell specimen.

EXAMPLE 2

Figure 4:
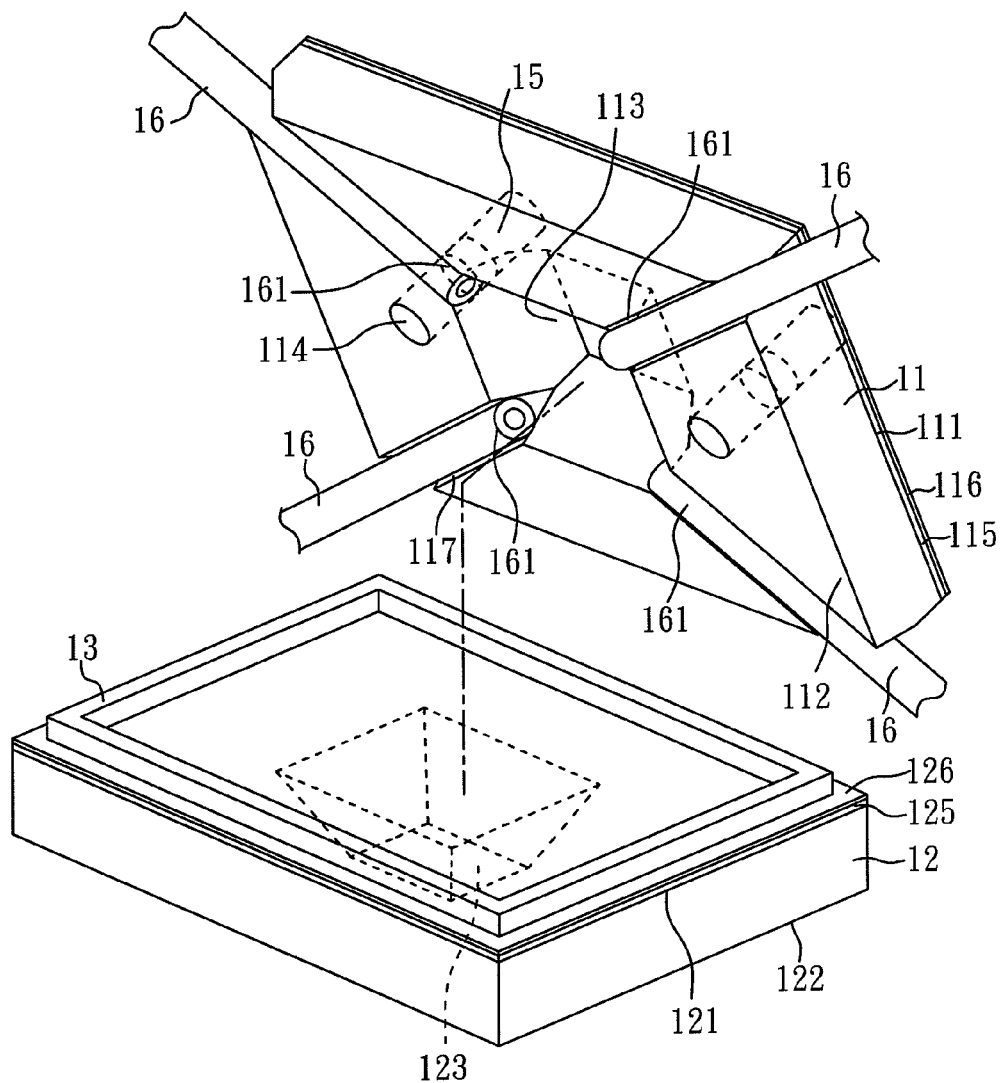
FIG. 4 is a perspective view showing the specimen box for an electron microscope of the example 2.

FIG. 4 is a perspective view showing the specimen box for an electron microscope of the example 2. According to FIG. 4, the specimen box of the present example is roughly the same as example 1. The only difference is the disposition of the metal adhesion layer 13. In the present example, the metal adhesion layer 13 is disposed between the second surface 112 and the second protective layer 126. Four of the third concaves 117 are formed on the second surface 112 of the first substrate 11 by a dry etching process. The photoelectric element 16, which is disposed on the third concave 117, is an optical fiber, an electrode, or the combination thereof.

The volume of the space (not shown) in the present example is 2 mm$^3$. The height of the space (not shown) is 550 μm. In the present example, the volume of the space (not shown) is smaller than example 1, so the resolution is higher than example 1. Therefore, different volumes of the space (not shown) of the specimen box could be chosen according to different requirements of the observation, such as the volume of the specimen, and the required resolution.

EXAMPLE 3

Figure 5:
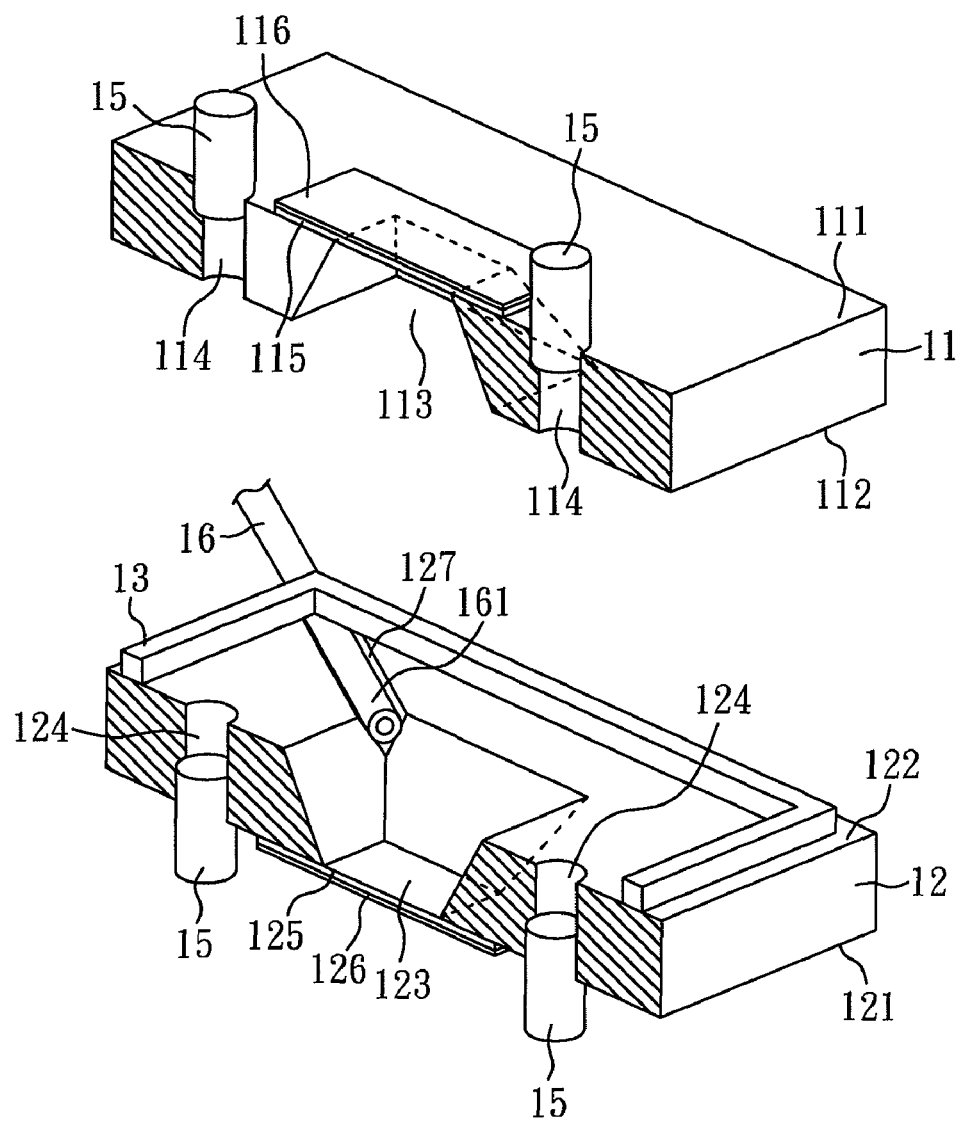
FIG. 5 is a perspective view showing the specimen box for an electron microscope of the example 3.

FIG. 5 is a perspective view showing the specimen box for an electron microscope of the example 3. According to the FIG. 5, the specimen box of present example is roughly the same as example 1. The only difference in the present example is the first thin film 115, the first protective layer 116, the second thin film 125, and the second protective layer 126 are only disposed on the first concave 113 and the second concave 123 to enhance the structure of the first concave 113 and the second concave 123. Therefore, the first thin film 115 and the second thin film 125 would not be cracked so as to avoid the specimen escaping from the space (not shown).

A fourth concave 127 is formed on the second surface 122 of the second substrate 12 by a wet etching process. The photoelectric element 16 is disposed on the fourth concave 127, in which the photoelectric element 16 is an optical fiber, an electrode, or a combination thereof.

In addition, the first through holes 114 and the second through holes 124 are formed by a deep reactive-ion etching process. Therefore, the first through holes 114 are penetrated through the first surface 111, and the second through holes 124 are penetrated through the third surface 121. The hole size of the first through holes 114 is 250 μm, and the hole size of the second through holes 124 is also 250 μm. Finally, the material of the plugs 15 in the present example is Ni—Ti alloy, and the plugs 15 could also seal the first through holes 114 and the second through holes 124 to seal the specimen box completely.

Although the present invention has been explained in relation to its preferred embodiment, it is to be understood that many other possible modifications and variations can be made without departing from the spirit and scope of the invention as hereinafter claimed.

What is claimed is:

1. A specimen box for an electron microscope, comprising:
   a first substrate, which has a first surface, a second surface, a first concave, and one or more first through holes, wherein the first concave is disposed on the second surface, a first thin film corresponding to the first concave is disposed on the first surface, and the first through hole is disposed around the first concave and penetrates through the first substrate;
   a second substrate, which has a third surface, a fourth surface, and a second concave, wherein the second concave is disposed on the fourth surface, and a second thin film corresponding to the second concave is disposed on the third surface;
   a metal adhesion layer, which is disposed between the first substrate and the second substrate; and one or more photoelectric elements, which comprises one or more ends, and the photoelectric element is disposed between the first substrate and the second substrate;

wherein a space is formed by the first substrate, the second substrate, and the metal adhesion layer, and the end is disposed in the space.

2. The specimen box for an electron microscope as claimed in claim 1, wherein the first through hole penetrates through the first thin film.

3. The specimen box for an electron microscope as claimed in claim 1, wherein the metal adhesion layer is disposed between the second surface and the fourth surface.

4. The specimen box for an electron microscope as claimed in claim 1, wherein the metal adhesion layer is disposed between the second surface and the second thin film.

5. The specimen box for an electron microscope as claimed in claim 1, wherein the photoelectric element is independently a photo fiber or an electrode.

6. The specimen box for an electron microscope as claimed in claim 1, wherein the second substrate further comprises one or more second through holes, wherein the second through hole is disposed around the second concave and penetrates through the second substrate.

7. The specimen box for an electron microscope as claimed in claim 1, wherein the hole size of the first through hole is 10 µm to 1000 µm.

8. The specimen box for an electron microscope as claimed in claim 6, wherein the hole size of the second through hole is 10 µm to 1000 µm.

9. The specimen box for an electron microscope as claimed in claim 1, wherein the specimen box further comprises one or more plugs assembled into the first through holes.

10. The specimen box for an electron microscope as claimed in claim 6, wherein the specimen box further comprises one or more plugs assembled into the second through holes.

11. The specimen box for an electron microscope as claimed in claim 1, wherein the material of the first thin film and the second thin film is independently silicon dioxide ($SiO_2$), silicon nitride ($Si_3N_4$), or a combination thereof.

12. The specimen box for an electron microscope as claimed in claim 1, wherein the thickness of the first thin film and the second thin film is independently 1 nm to 100 nm.

13. The specimen box for an electron microscope as claimed in claim 1, wherein a first protective layer is disposed on the surface of the first thin film.

14. The specimen box for an electron microscope as claimed in claim 13, wherein the material of the first protective film is silicon nitride ($Si_3N_4$).

15. The specimen box for an electron microscope as claimed in claim 1, wherein a second protective layer is disposed on the surface of the second thin film.

16. The specimen box for an electron microscope as claimed in claim 15, wherein the material of the second protective film is silicon nitride ($Si_3N_4$).

17. The specimen box for an electron microscope as claimed in claim 1, wherein the material of the first substrate and the second substrate is independently silicon substrate, glass substrate, or polymer substrate.

18. The specimen box for an electron microscope as claimed in claim 1, wherein the thickness of the first substrate and the second substrate is independently 10 µm to 1000 µm.

19. The specimen box for an electron microscope as claimed in claim 1, wherein the metal adhesion layer comprises a metal material, wherein the metal material is selected from a group consisting of Ti, Cr, Sn, In, Bi, Cu, Ag, Ni, Zn, Au, and Ti—W alloy.

20. The specimen box for an electron microscope as claimed in claim 1, wherein the material of the plugs is selected from a group consisting of Ni—Ti alloy, copper-base alloy, Cu—Zn alloy, Cu—Al—Mn alloy, Cu—Al—Ni alloy, Cu—Al—Be alloy, Cu—Al—Be—Zr alloy, and Cu—Al—Ni—Be alloy.

21. The specimen box for an electron microscope as claimed in claim 1, wherein the volume of the space is 0.01 $mm^3$ to 100 $mm^3$.

* * * * *